US005463640A

United States Patent [19]
Cloetens

[11] Patent Number: 5,463,640
[45] Date of Patent: Oct. 31, 1995

[54] DEVICE AND METHOD FOR DECODING A STREAM OF DATA SYMBOLS WHICH ARE INTERLEAVED AND SUBJECT TO A DISCONTINUITY THEREOF INVOLVING LABELLING THOSE DATA SYMBOLS WHICH ARE SUSPECT AS A RESULT OF THE DISCONTINUITY

[75] Inventor: Henri Cloetens, Leuven, Belgium

[73] Assignee: U.S. Philips Corporation, New York, N.Y.

[21] Appl. No.: 78,790

[22] Filed: Jun. 16, 1993

[30] Foreign Application Priority Data

Jul. 7, 1992 [EP] European Pat. Off. ............... 92202056

[51] Int. Cl.$^6$ .................................................. G06F 11/10
[52] U.S. Cl. ........................ 371/37.1; 371/381; 371/39.1
[58] Field of Search ............................. 371/37.1, 38.1, 371/39.1, 40.1, 37.4, 37.8, 37.5

[56] References Cited

U.S. PATENT DOCUMENTS

| | | | |
|---|---|---|---|
| 4,683,572 | 7/1987 | Baggen et al. | 371/39.1 |
| 4,769,819 | 9/1988 | Matsutani et al. | 371/38.1 |
| 4,835,772 | 5/1989 | Peile et al. | 371/40.1 |
| 4,999,828 | 3/1991 | Pollen et al. | 369/59 |
| 5,297,153 | 3/1994 | Baggen et al. | 371/37.1 |

Primary Examiner—Roy N. Envall, Jr.
Assistant Examiner—Thomas E. Brown
Attorney, Agent, or Firm—Richard A. Weiss

[57] ABSTRACT

A decoding device and method for a data stream that represents a user signal and makes up multi-symbol words that are protected against burst errors. In case of a discontinuity, a FIFO jump may occur in the decoding device. Subsequently, de-interleaving may occur, and this will cause the multi-symbol words to be made up from symbols which occur before and after the discontinuity. If this is the case, within such words, the minority symbols are flagged. If too many words have an excessive number of flags, error correction will fail. If so, an error concealment operation occurs, but the number of such concealments is kept minimum. This will decrease the subjective quality of the user signal by only a minimum amount.

20 Claims, 4 Drawing Sheets

DEVICE AND METHOD FOR DECODING A STREAM OF DATA SYMBOLS WHICH ARE INTERLEAVED AND SUBJECT TO A DISCONTINUITY THEREOF INVOLVING LABELLING THOSE DATA SYMBOLS WHICH ARE SUSPECT AS A RESULT OF THE DISCONTINUITY

BACKGROUND OF THE INVENTION

The invention relates to a decoding device and method for decoding a data symbol stream representing a user signal and being organized according to a systematic interleaving mechanism among the symbols. The device comprises a de-interleaving unit for de-interleaving the data symbol stream to temporal conformity with the user signal; a contingency detector for detecting a system contingency and thereupon providing pointers indicating selective symbols as suspect; and a remedial unit for, under control of the pointers, executing a remedial operation in reconstructing the user signal. Without limitation, the user signal may be continuous audio, video, data, or a mixture thereof.

Various remedial organizations have been proposed for coping with disturbances of a data stream. First, if an analog representation of the user signal has a more or less continuous character, interpolation between contiguous samples may be used to substitute for erroneous samples. Second, various digital error protection formats have been standardized, such as for Compact Disc, Digital Compact Cassette, and other consumer entertainment media. The error protection usually operates on three levels: first, detection as to whether an error is actually present; second, a decision on effective error correction measures; and third, if correction is impossible concealment. Various strategies have been published. The correction may be impossible for a variety of reasons:

a. too many random errors, for example, if the data is broadcast at an insufficient signal strength (in this case, detection on the symbol level indicates that demodulation is impossible);

b. burst error, for example, in case a record carder has mechanical damage (in this case, the detection may be through specific non-zero syndrome symbols); and c. system error, for example, in case of a track loss or a track jump (in this case, the signalization may be external, through a cross-track command or a track loss detector, respectively).

In such audio systems, the error correction operates on the level of digital symbols, and the concealment operates on the level of the analog samples. Various other multi-tiered organizations are feasible. This means that the user signal may be accessible at various stages of its development.

All of the above has been recited by way of example only.

BACKGROUND TO THE INVENTION

The third case, supra, and its handling have been described in U.S. Pat. No. 4,999,828. A track may be lost intentionally, or accidentally and the track loss may be detected according to optical principles. The error causes a decodable word to contain symbols which may be fully correct but constitute parts of respective different source code words. Through the addition of pointers on the system level, the device will temporarily refrain from decoding, which may prove impossible and furthermore, may additionally cause loss of decoding time.

As a result, the track loss will no longer cause clicks in the audio signal of a CD-player. However, there are two disadvantages to this organization. First, there is a specific detector outside the data channel. Second, the connection with the actual data symbol stream is loose, which necessitates an enormous number of pointers that drive the device to long-range interpolations and other measures that influence the subjective quality of the user signal, in particular when this signal is audio.

SUMMARY OF THE INVENTION

It is an object of the present invention to mitigate the negative influences of various kinds of disturbances in a stream of data symbols, of which the reference represents only a particular case; and, in particular, to largely avoid or diminish the negative influences of such disturbance on the structure of the user signal through adequately minimizing the numbers of pointers used to an appropriate level. According to one of its aspects, the invention is characterized in that the contingency is a reception discontinuity in the data symbol stream before de-interleaving, the device described in the opening paragraph is such that it includes a unit for providing a mapping point of the discontinuity onto the user signal, and the detector of that device is arranged for providing the pointers with respect to symbols received before the discontinuity and de-interleaved to after the mapping point and also with respect to symbols received after the discontinuity and de-interleaved to before the mapping point. The ascertaining of the contingency as a reception discontinuity in the data stream keeps as close to the actual damage as possible. Various detector types are feasible. A particular simple one would be to measure the distance between successive synchronization words in the data symbol stream. Any discrepancy over, say, more than two bits would signal some disturbance due to an arbitrary cause. Moreover, the assigning of pointers in this way is also a straightforward procedure.

When the decoding device has a FIFO, FIFO jumps may occur such that the data source has a variable rate outside the range that is normally accomodatable by the FIFO. This situation could be present even if no track loss occurs. It should be clear that FIFO capacity will be kept low for reasons of cost. So there could occur a FIFO overflow as well as a FIFO running empty. These cases are remedied by a FIFO reset, which will be explained in detail hereinafter. The reference described above does not cover such overflow situations, and it is an advantageous aspect of the invention when the contingency is a FIFO-jump, or a FIFO-overflow with a read-reset combination.

In one embodiment, the remedial operation is based on multi-symbol words after de-interleaving, and the symbols provided with pointers are minority symbols with respect to symbols that are received with respect to discontinuity in a temporal direction that is in conformity with that of their de-interleaving destination with respect to the mapping point. Restricting to the in-word minority symbols means that the device automatically stays "at the optimistic side", and the rejecting of total words as unreliable is kept to a minimum. In audio practice, this diminishes the number of clicks to a single one for each FIFO jump. Similar arguments also apply to video, a mixture of audio and video, and other user signals. In the context of present invention, interleaving means that symbols representing the user signal which are contiguously positioned for executing the remedial operation are within the data symbol stream dispersed in a systematic manner to mitigate the possible effects of bursts.

The dispersion may be effected either within a finite block, or on the basis of convolution with respect to time.

In another embodiment, the remedial operation is effected through the use of a symbol error correcting code. These codes have been found extremely powerful, and are effectively in wide use. However, other measures would be useful as well, such as interpolation, or even recourse the some higher mechanism, such as would be effected in a system with dialogue. Also various mixtures could be feasible.

In a further embodiment, the device has an interface unit for interfacing with an inertial record carrier. If the record carrier has an appreciable inertia, it may be subject to shock and acceleration that could influence the dam rate appreciably, and the invention diminishes the nuisance caused by the discontinuity.

In still another embodiment, the record carrier is a disc and the discontinuity is based on a tangential acceleration of the record carrier. Rotatable discs are subject to strong accelerations, and the invention solves an important problem.

The invention also relates to the method used by the decoding device. Various other advantageous aspects of the invention are described hereinafter.

BRIEF DESCRIPTION OF THE DRAWINGS

The invention will explained in detail hereinafter with respect to a nonlimiting preferred embodiment that is shown in and by the accompanying drawings, in which.

DETAILED DESCRIPTION OF A PREFERRED EMBODIMENT

Figure 1:
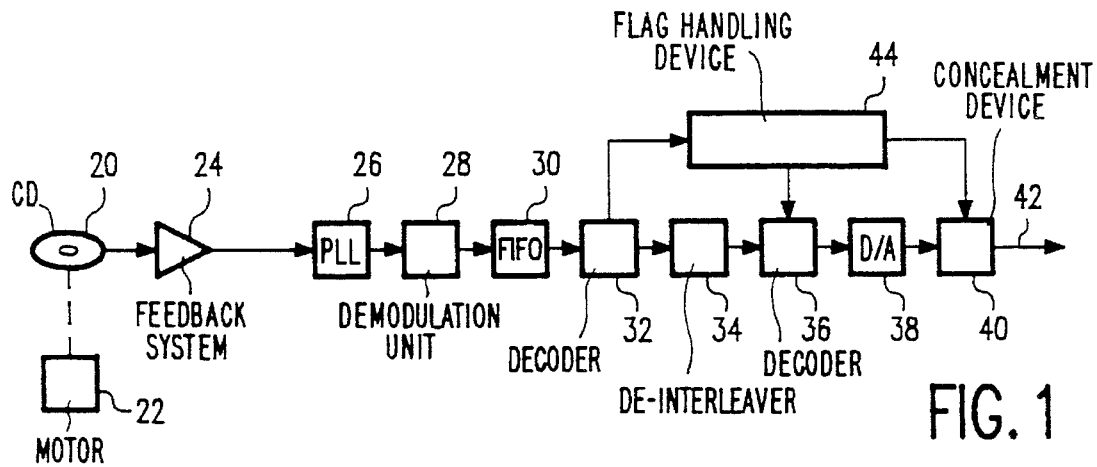
FIG. 1 is a block diagram of a decoding device that does not embody the present invention.
Figure 3:
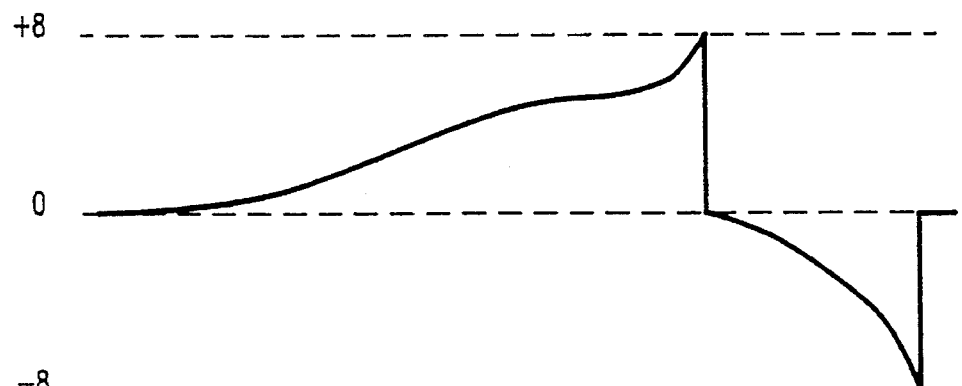
FIG. 3 shows exemplary time dependent FIFO filling degrees.

FIG. 1 is a block diagram of a decoding device in a Compact Disc environment that does not embody the present invention. Inasmuch as various Compact Disc systems have been published and are in wide use, discussion of this device is limited. Compact Disc 20 is shown symbolically, and it is rotated by a motor 22 that includes driving feedback. Element 24 symbolizes the pick-up inclusive of various optical, electrical/electronic, and feedback systems. Element 26 symbolizes a phase-locked loop that outputs a stream of clipped channel bits, inclusive of synchronization patterns. Element 28 symbolizes a unit for demodulation that receives a string of 14-bit channel words that are pairwise separated by three separation bits and outputs a string of eight bit code symbols. For simplicity, synchronization headers are ignored. As regards the demodulation, demodulation flags that could signal irregular channel words are ignored. Element 30 represents a FIFO that operates on a symbol basis and has independent writing from element 28 as well as reading to element 32. The FIFO has an overflow detector not shown that will reset the FIFO in case of overflow. The resetting may be done by resetting the read pointer. If the rotation of the record is accelerated or decelerated, such as through slight motions while rotating, the filling degree of the FIFO may change somewhat between acceptable limits. In this respect, FIG. 3 shows exemplary time dependent FIFO filling degrees. Half-way filling is filling degree zero and is considered optimum. Maximum filling degree is +8 frames of 32 symbols each, and minimum filling degree is −8 frames, both relative with respect to a half-way filling degree. Total capacity of the FIFO is 16 frames. Read-out is done by the next stage, which also sees to the de-interleaving of the symbols. In practice, the actual filling degrees are represented by the positional differences between writing pointer and reading pointer.

FIG. 3 shows an initial interval where the filling is halfway. Next, the filling degree increases through increase of the source data rate. When, at a particular instant, the value +8 is reached, there occurs a FIFO reset to filling degree zero (actually halfway full). This resetting renders part of the presently stored data in the FIFO inconsequential because they will not be read. Next, the example in FIG. 3 shows that the source data rate decreases, so that the FIFO filling degree diminishes (the destination data rate is constant in good approximation). Upon reaching a value of −8, the FIFO is reset to a notional filling degree of zero (actually halfway full). This causes the most recent −8 frames to be read a second time, as reading is non-destructive.

In a Compact Disc, element 32 of FIG. 1 symbolizes the decoding of 32 symbol C1 words that are encoded according to a Reed-Solomon code that is systematic on the symbol level. The decoding results are 28 data symbols accompanied by a set of flags that signal various levels of confidence on either a word level or on a symbol level. The flags are forwarded to element 44 that symbolizes a flag handling device. Element 34 symbolizes a de-interleaver that distributes the decoded symbols symbol by symbol over 28 symbol C2 words that are again Reed-Solomon encoded according to a code that is systematic on the symbol level. Element 36 symbolizes the decoding of these 28 symbol C2 words and is co-controlled by appropriate flags received from the flag handling device 44. This decoding may produce new flags for element 44. Element 38 symbolizes a digital to analog converter that should in principle reproduce the user signal as a stream of time discrete and quasi-analog sample amplitudes. Element 40 symbolizes a concealment device that is activated by appropriate flag information received from flag handling device 44. Samples that are not reproducible by the main channel of elements 24 through 38, are now quasi reproduced through concealment of the output result actually received from element (i.e., converter) 38.

Various concealment strategies have become conventional, such as holding of previous value, interpolating between previous and following samples according to formula of various levels of refinement. A further possibility is even complete muting of a sample that is then set at value zero. An embodiment of decoding has been described in U.S. Pat. No. 4,683,572. In the decoding and de-interleaving, extensive use is made of storage space that allows the mutual time relationships between symbols that form part of a single word to be amended.

A reset of the FIFO introduces a data discontinuity in time. Each time that the D/A converter outputs a sample from the first side of the discontinuity directly followed by one from the second side of the discontinuity, the output will produce a click signal. Herein first and second may mean before and after the discontinuity, respectively, or the other way around.

Figure 2:
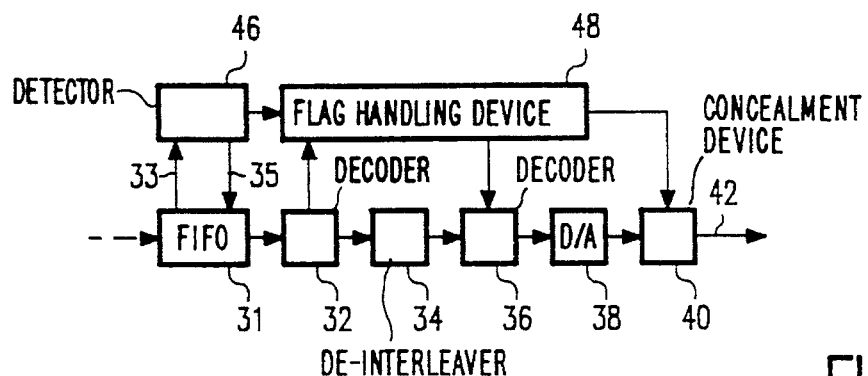
FIG. 2 is a block diagram of an improved decoding device according to the invention.

FIG. 2 is a block diagram of an improved decoding device according to the present invention. Inasmuch as a large part of the device is not changed with respect to FIG. 1, elements 20 . . . 28 have not been shown. Furthermore, unchanged elements carry identical reference numerals. Block 46 is a FIFO overflow manager device that detects an overflow or underflow of FIFO 31 on the basis of a specific signalization on line 33, and in case of overflow, resets FIFO 31 through signalization on line 35. Moreover, a certain part of the FIFO contents are subsequently labelled (as will be explained hereinafter) as unreliable. This labelling may be appended to the contents of FIFO 31. A different solution is to a forward this information to flag handling device 48, which has a somewhat more complicated structure than element 44 of FIG. 1. The remaining elements 34 . . . 42 are identical to their namesakes in FIG. 1.

Figure 4A:
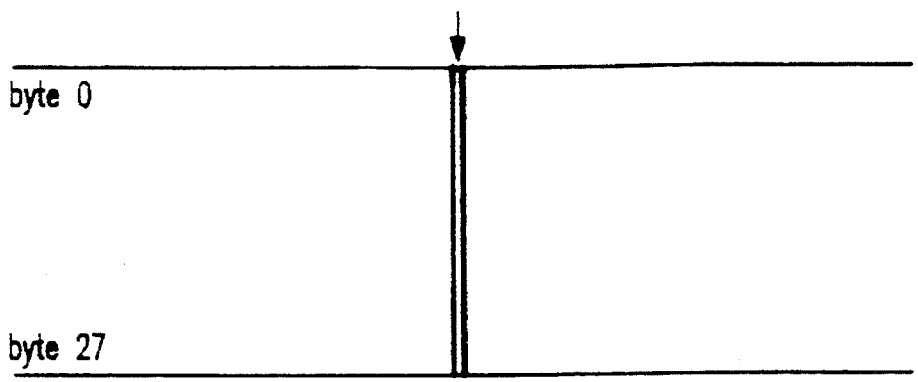
FIG. 4a shows a FIFO dam discontinuity after FIFO overflow.

Now, FIG. 4a shows a FIFO data discontinuity after FIFO over-flow. Along the vertical direction, each row gives the byte number for the 28 byte C2 code words which are part of the C1 code words [word,] each C1 code word occupying one column and the C2 code words dispersed along the various rows diagonally. For convenience, the parity check symbols of the C1 code words have not been shown. In effect, they should cover four additional rows, but they do not constitute a part of the C2 code words. The vertical line indicates the actual occurrence of the discontinuity, that is, contiguous words need not have contiguous word numbers. For simplicity, any partial C1 code word has been suppressed so that the discontinuity is effectively at the C1 code word boundary. In practice, such is effected by the write pointer always being started upon the reception of the synchronization symbol. Upon the next synchronization symbol, the pointer is stepped for receiving the next frame/word. If, however, the C1 code word contains less than the intended number of symbols, the writing of the next C1 code word in effect overwrites this incomplete word.

Figure 4B:
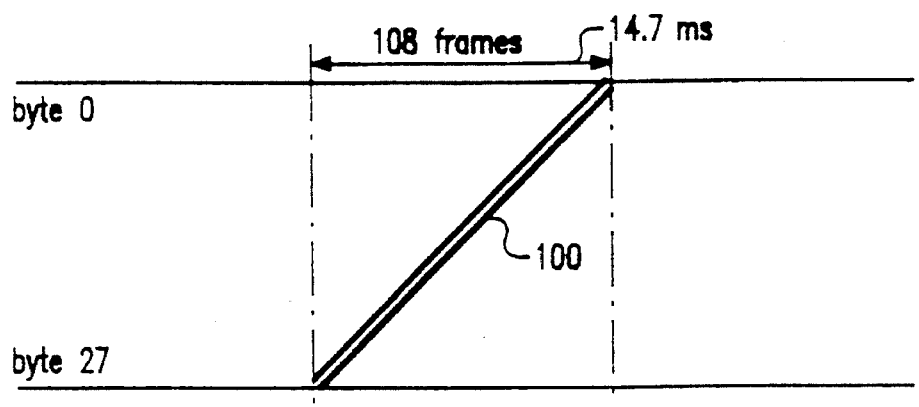
FIG. 4b shows FIG. 4a after de-interleaving.

FIG. 4b shows FIG. 4a after de-interleaving in element 34 as mapped on the input information stream. (Each C2 code word are disposed among the rows diagonally.) The discontinuity is now stretched in the horizontal direction over a span of 4*27=108 frames=14.7 msecs. To the left of inclined line 100, all symbols pertain to the time before the reset discontinuity, and to the right of the line 100, all symbols pertain to the time after the reset discontinuity, if the time goes from left to fight in the figure.

Figure 4C:
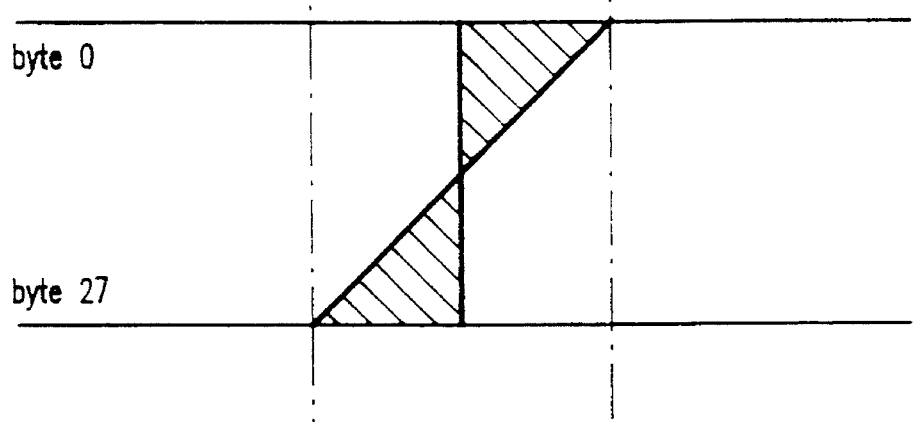
FIG. 4c shows FIG. 4b after flagging according to the invention.

FIG. 4c shows FIG. 4b after flagging according to the invention. Here, on both sides of the inclined discontinuity, all symbols which within their column form a minority are flagged as being suspect, indicated by hatching.

Figure 4D:
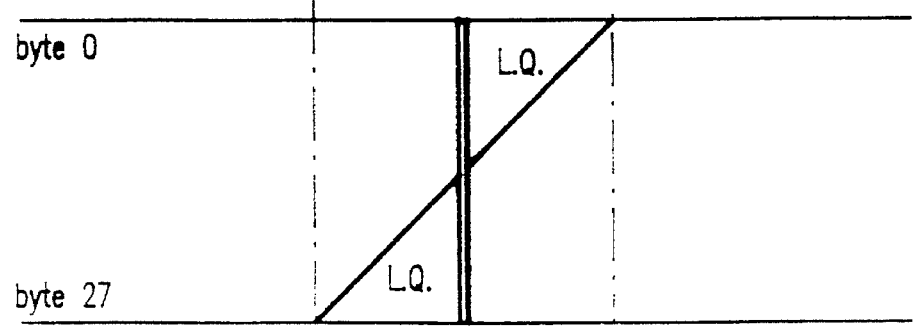
FIG. 4d shows the disposition of low-quality data in FIG. 4c.

FIG. 4d shows the disposition of low-quality (L.Q.) data in FIG. 4c. That data will either be corrected by the C2 decoder, or if this proves impossible due to too many symbol flags within a single C2 word, an interpolation sample will be produced. The discontinuity will be restricted in duration, and will also be less audible. If necessary, the remaining discontinuity is concealed by soft muting.

Figure 5A:
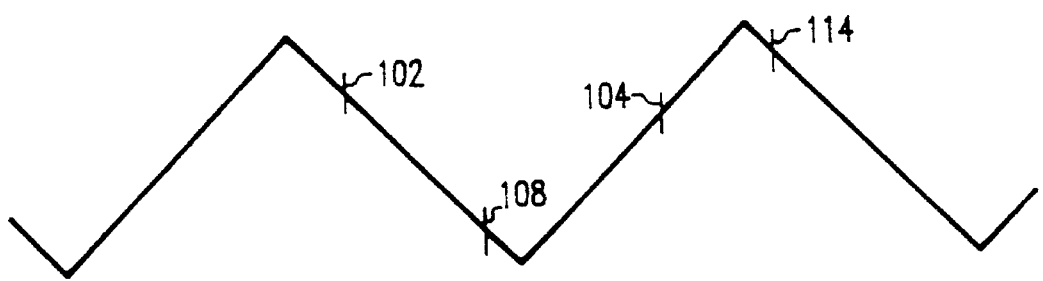
FIG. 5a shows a user signal example.
Figure 5B:
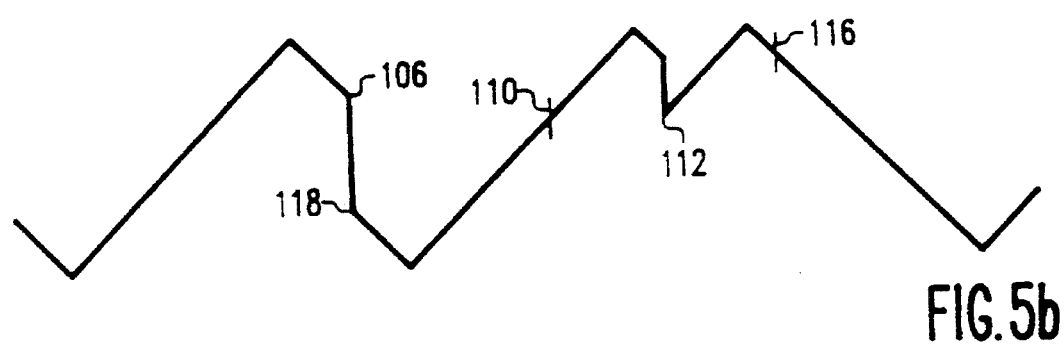
FIG. 5b shows the user signal of FIG. 5a exhibiting discontinuities.

FIG. 5a shows an exemplary user signal in the shape of a triangular and periodic waveform. Four specific points have been indicated in the waveform 102, 104, 108 and 114. FIG. 5b shows the same user signal exhibiting discontinuities. At instant 106 in FIG. 5b, corresponding to 102 in FIG. 5a, the signal value in FIG. 5b steps down to that of 118 in FIG. 5b, corresponding to 108 in FIG. 5a. As a result, in FIG. 5b stretch between 102 and 108 of FIG. 5a is bypassed. Furthermore, between 110 and 112 of FIG. 5b, the signal of FIG. 5b corresponds to that of FIG. 5a between 104 and 114. Here, however, the latter stretch is repeated between 112 and 116. Other discontinuities may combine the effects of FIGS. 5a and 5b.

Figure 6:
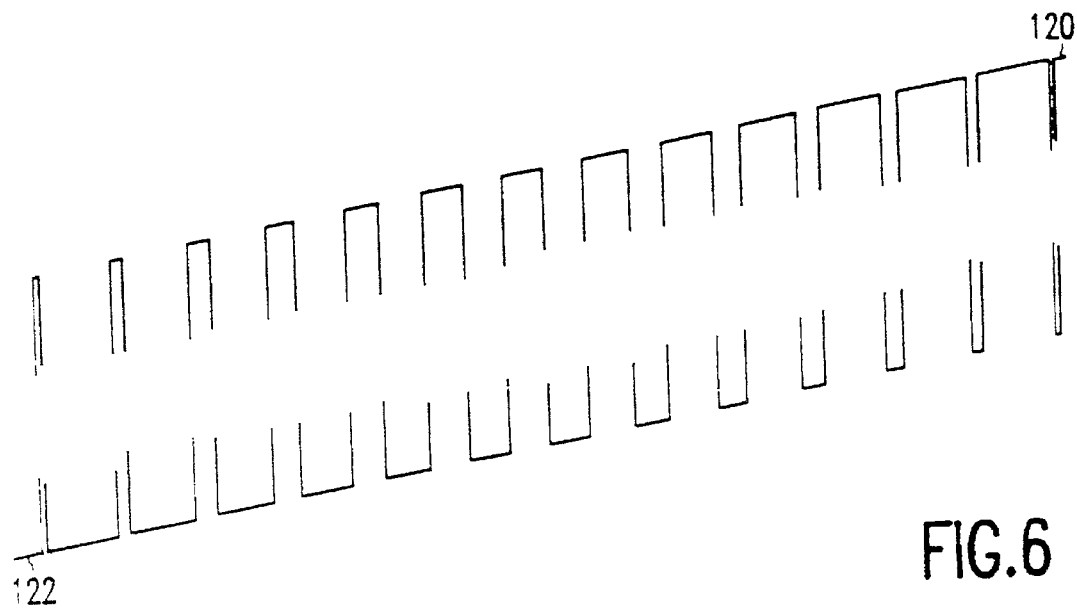
FIG. 6 shows the effect of a discontinuity in combination with interleaving.

FIG. 6 shows the effect of a discontinuity with interleaving. As shown, there is a user signal 122 far before the discontinuity, and a user signal 120 far behind the discontinuity. The discontinuity is of the type 106/118 in FIG. 5a, but de-interleaving must still be executed. As a result, the user signal jumps back and forth between two signals that correspond to respective extensions of the signals at 122, 120, respectively. In the beginning the user signal most often corresponds to an extension of signal 122 and rarely to an extension of signal 120. Later on, the two extensions occur more or less equal fractions of time. At the end, the user signal most often corresponds to an extension of signal 120. The transition between these three cases is gradual. As would be clear from FIG. 5b, the slopes of signals 120 and 122 may be different and also have mutually different signs. Also the signals 120 and 122 may in effect have an interception point. For convenience, signals 120 and 122 have been drawn as continuous. This however, is not a restriction, inasmuch as, for example, a second de-interleaving operation could have been designed into the system.

Figure 7:
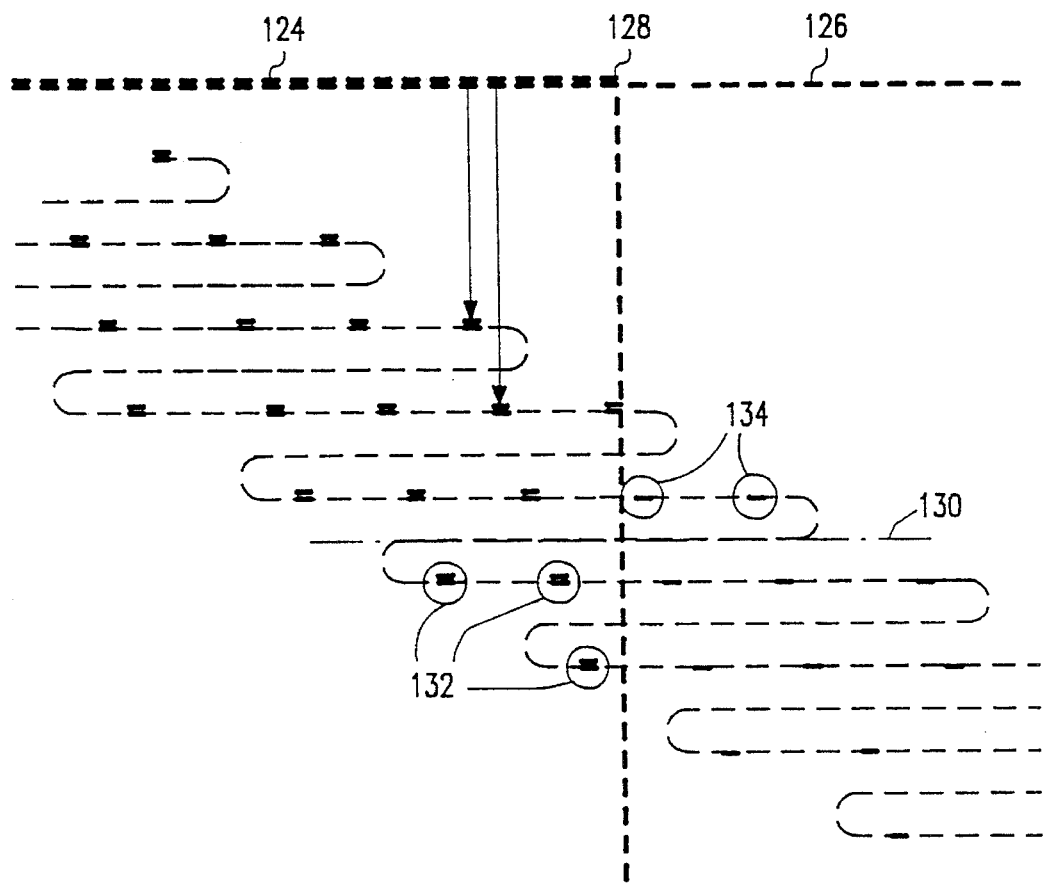
FIG. 7 shows the effect on a symbol basis in an elementary example.

FIG. 7 shows the effect on a symbol basis in an elementary example. The interleaved symbol stream is shown at the top as the sequence 124/126: double lines versus single lines each represent one symbol. At 128 a discontinuity occurs. The case in which the discontinuity occurs on a lower-than-symbol level is ignored. At most this would lead to a single invalid symbol. This would not influence the subsequent reasoning. Interleaving is shown as having five successive symbols mapping on five successive words that each consist of five symbols. Each word is shown on a single horizontal row. The sequence of the user signal is according to the dotted line that meanders through the succession of words, from left to right. The discontinuity 128 is mapped on an instant in the user signal that is indicated by horizontal wavy line 130. Symbols 132 occur before the discontinuity, but after the mapping point. As a result, they get a flag or pointer. On the other hand, symbols 134 occur after the discontinuity, but before the mapping point. They also get a flag or pointer. If the words are two-symbol correcting by some error protective code, this means that they could be corrected to "good" words. A final transition now remains on mapping point 130. Without additional measures, this would cause a single click. Through conventional softmuting, this click is masked, however.

The system explained supra may be used in a more complex environment. First, the interleaving pattern could be more complicated, which only would influence the number of symbols the receive a pointer. Second, other symbols could be interspersed that would not adhere to the interleaving pattern, such as headers. These would simply be ignored, with respect to the present invention. Third, the mapping point and/or the discontinuity may be positioned slightly away from their correct values. For example, if discontinuity 128 were replaced one symbol to the left, this would cause a pointer for one additional symbol. Generally this would cause extremely little deterioration to the ultimate user signal. Likewise, replacing it one position to the right would leave one symbol without pointer. A slight misplacement of the mapping point (such as raising or dropping it by one word) likewise would have little influence. The overall effect of such misalignments in practice is small, because near the mapping point most words are incorrectible anyhow because they always have a high percentage of flagged symbols, regardless of the exact location of the mapping point. However, the number of flagged symbols quickly decreases as one moves away from the mapping point, and the performance generally remains near optimal. Another solution would be that near the mapping point a small number of words are declared invalid, or that the mapping point is defined as a diffuse region around wavy line 130. An essential element, however, remains that the flagging strategy is based on the properties of the data stream itself.

The embodiments as described represent the preferred embodiments. Various smaller or larger deviations would not depart from the background idea of the invention. Generally, such procedure would leave a minimal number of C2 words uncorrectable while not causing an excessive number of flags to degrade the signal quality.

I claim:

1. A decoding device for decoding a stream of data symbols representing a user signal, the data symbols being organized according to a systematic interleaving mechanism among the data symbols so as to have an interleaved pattern, the device comprising:

de-interleaving means for de-interleaving the stream of data symbols so that the data symbols have an de-interleaved pattern which is in temporal conformity with the user signal;

detector means for detecting a discontinuity of the stream of data symbols prior to de-interleaving;

labelling means for labelling certain of the data symbols suspect on the basis of a comparison between where the discontinuity appears with respect to the data symbols in both the interleaved pattern and the de-interleaved pattern which enables a determination as to which data symbols occur before the discontinuity and which data symbols occur after the discontinuity when the data symbols are in the interleaved pattern and when the data symbols are in the de-interleaved pattern; and remedial means for executing a remedial operation in reconstructing the user signal from the stream of data symbols subsequent to de-interleaving on the basis of the data symbols which are labelled suspect;

wherein the data symbols which are labelled suspect are the data symbols which (a) occur prior to the discontinuity when the data symbols are in the interleaved pattern but after the discontinuity when the data symbols are in the de-interleaved pattern, and (b) occur after the discontinuity when the data symbols are in the interleaved pattern but prior to the discontinuity when the data symbols are in the de-interleaved pattern.

2. The device as claimed in claim 1, further comprising a FIFO buffer memory coupled to said de-interleaving means and said detector means, wherein the discontinuity is caused by a FIFO-jump.

3. The device as claimed in claim 1, further comprising a FIFO buffer memory coupled to said de-interleaving means and said detector means, wherein the discontinuity is caused by a FIFO-overflow with a read-reset combination.

4. The device as claimed in claim 1, further comprising electromechanical interface means for receiving the stream of data symbols prior to interleaving from an inertial record carrier.

5. The device as claimed in claim 4 wherein said record carrier is a disc, and the discontinuity is based on a tangential acceleration of said record carrier.

6. The device as claimed in claim 1, wherein the data symbols make up multi-symbol words that are error protected.

7. The device as claimed in claim 1, wherein each of the data symbols forms a part of one of a plurality of first code words encoded in accordance with a first error protection code that is systematic on a symbol level, the data symbols of the first code words including redundant data symbols and other data symbols, and each of the other data symbols forms a part of one of a plurality of second code words encoded in accordance with a second error protection code.

8. The device as claimed in claim 7, wherein the interleaved pattern is such that the first code words follow one another serially, and the de-interleaved pattern is such that the second code words follow one another serially.

9. The device as claimed in claim 7, wherein the first error protection code is a C1 error protection code and the second error protection code is a C2 error protection code.

10. The device as claimed in claim 7, further comprising means for detecting whether data symbols which are labelled suspect and are a part of one of the second code words are in a minority with respect to all data symbols which are a part of the second code word, and if so, causing said remedial means to treat the data symbols which are labelled suspect and are a part of the second code word as erasure data symbols.

11. The device as claimed in claim 1, wherein said remedial operation is a softmuting.

12. The device as claimed in claim 1, wherein said labelling means is a part of said detector means.

13. A self-contained portable unit, comprising: the device as claimed in claim 1; and output means for supplying the user signal.

14. A method of decoding a stream of data symbols representing a user signal, the data symbols being organized according to a systematic interleaving mechanism among the data symbols so as to have an interleaved pattern, the method comprising:

detecting a discontinuity of the stream of data symbols prior;

de-interleaving the stream of data symbols subsequent to detecting the discontinuity so that the data symbols have an de-interleaved pattern which is in temporal conformity with the user signal;

labelling certain of the data symbols suspect on the basis of a comparison between where the discontinuity appears with respect to the data symbols in both the interleaved pattern and the de-interleaved pattern which enables a determination as to which data symbols occur before the discontinuity and which data symbols occur after the discontinuity when the data symbols are in the interleaved pattern and when the data symbols are in the de-interleaved pattern; and reconstructing the user signal from the stream of data symbols subsequent to de-interleaving on the basis of the data symbols which are labelled suspect;

wherein the data symbols which are labelled suspect are the data symbols which (a) occur prior to the discontinuity when the data symbols are in the interleaved pattern but after the discontinuity when the data symbols are in the de-interleaved pattern, and (b) occur after the discontinuity when the data symbols are in the interleaved pattern but prior to the discontinuity when the data symbols are in the de-interleaved pattern.

15. The method as claimed in claim 14, wherein the data symbols make up multi-symbol words that are error protected.

16. The method as claimed in claim 14, wherein each of the data symbols forms a part of one of a plurality of first code words encoded in accordance with a first error protection code that is systematic on a symbol level, the data symbols of the first code words including redundant data symbols and other data symbols, and each of the other data symbols forms a part of one of a plurality of second code words encoded in accordance with a second error protection code.

17. The method as claimed in claim 16, wherein the interleaved pattern is such that the first code words follow one another serially, and the de-interleaved pattern is such that the second code words follow one another serially.

18. The method as claimed in claim 17, wherein the first error protection code is a C1 error protection code and the second error protection code is a C2 error protection code.

19. The method as claimed in claim 16, further comprising detecting whether data symbols which are labelled suspect and are a part of one of the second code words are in a minority with respect to all data symbols which are a part of the second code word, and if so, causing said remedial means to treat the data symbols which are labelled suspect and are a part of the second code word as erasure data symbols.

20. The method as claimed in claim 14, wherein said remedial operation includes softmuting.

* * * * *